(12) United States Patent
Mouret et al.

(10) Patent No.: US 6,906,588 B2
(45) Date of Patent: Jun. 14, 2005

(54) VARIABLE-GAIN DIFFERENTIAL INPUT AND OUTPUT AMPLIFIER

(75) Inventors: Michel Mouret, Jarrie (FR); Marc Sabut, Eybens (FR); François Van Zanten, Meylan (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/451,086

(22) PCT Filed: Dec. 14, 2001

(86) PCT No.: PCT/FR01/04007
§ 371 (c)(1),
(2), (4) Date: Nov. 14, 2003

(87) PCT Pub. No.: WO02/49210
PCT Pub. Date: Jun. 20, 2002

(65) Prior Publication Data
US 2004/0066232 A1 Apr. 8, 2004

(51) Int. Cl.[7] .................................................. H03F 3/45
(52) U.S. Cl. .................... 330/254; 330/260; 330/278
(58) Field of Search .............................. 330/254, 260, 330/278

(56) References Cited

U.S. PATENT DOCUMENTS

| | | | |
|---|---|---|---|
| 5,684,431 A | 11/1997 | Gilbert et al. | 330/254 |
| 5,880,618 A | 3/1999 | Koen | 327/351 |
| 5,917,380 A | 6/1999 | Darthenay et al. | 330/278 |
| 6,141,169 A * | 10/2000 | Pietruszynski et al. | 360/67 |
| 6,704,560 B1 * | 3/2004 | Balteanu et al. | 455/333 |
| 6,763,228 B2 * | 7/2004 | Prentice et al. | 455/127.2 |
| 6,784,651 B2 * | 8/2004 | Mouret et al. | 323/315 |

FOREIGN PATENT DOCUMENTS

WO    WO 00/72446    11/2000

* cited by examiner

Primary Examiner—Patricia Nguyen
(74) Attorney, Agent, or Firm—Lisa K. Jorgenson; E. Russell Tarleton; Seed IP Law Group PLLC (57) ABSTRACT

A variable-gain amplifier with a differential input and differential output, including an attenuator block, receiving an input voltage and providing, on several outputs, voltages, each of which is equal to the attenuated input voltage; differential transconductor elements, each having a first input connected to a respective output of the attenuator block, and generating first and second positive currents and first and second negative currents; a current source assembly adapted to controlling the transconductance of each differential transconductor element according to an analog control signal; and an output block converting first and second input currents into a differential output voltage and providing a second input of each differential transconductor element with a feedback voltage depending on the output voltage.

13 Claims, 4 Drawing Sheets

VARIABLE-GAIN DIFFERENTIAL INPUT AND OUTPUT AMPLIFIER

BACKGROUND OF THE INVENTION

1. Field of the Invention

The present invention relates to a variable-gain amplifier, and in particular to such an amplifier with differential input and output, the gain of which varies exponentially as a response to an analog control voltage, and having a small harmonic distortion and reduced noise.

2. Description of the Related Art

FIG. 1 schematically shows an amplifier, which can be made in integrated circuit form, having a gain that varies exponentially as a response to an analog control voltage Vcom. The amplifier is intended for receiving a differential voltage V1in–V2in and for providing as a response a differential voltage V1out–V2out.

Figure 1:
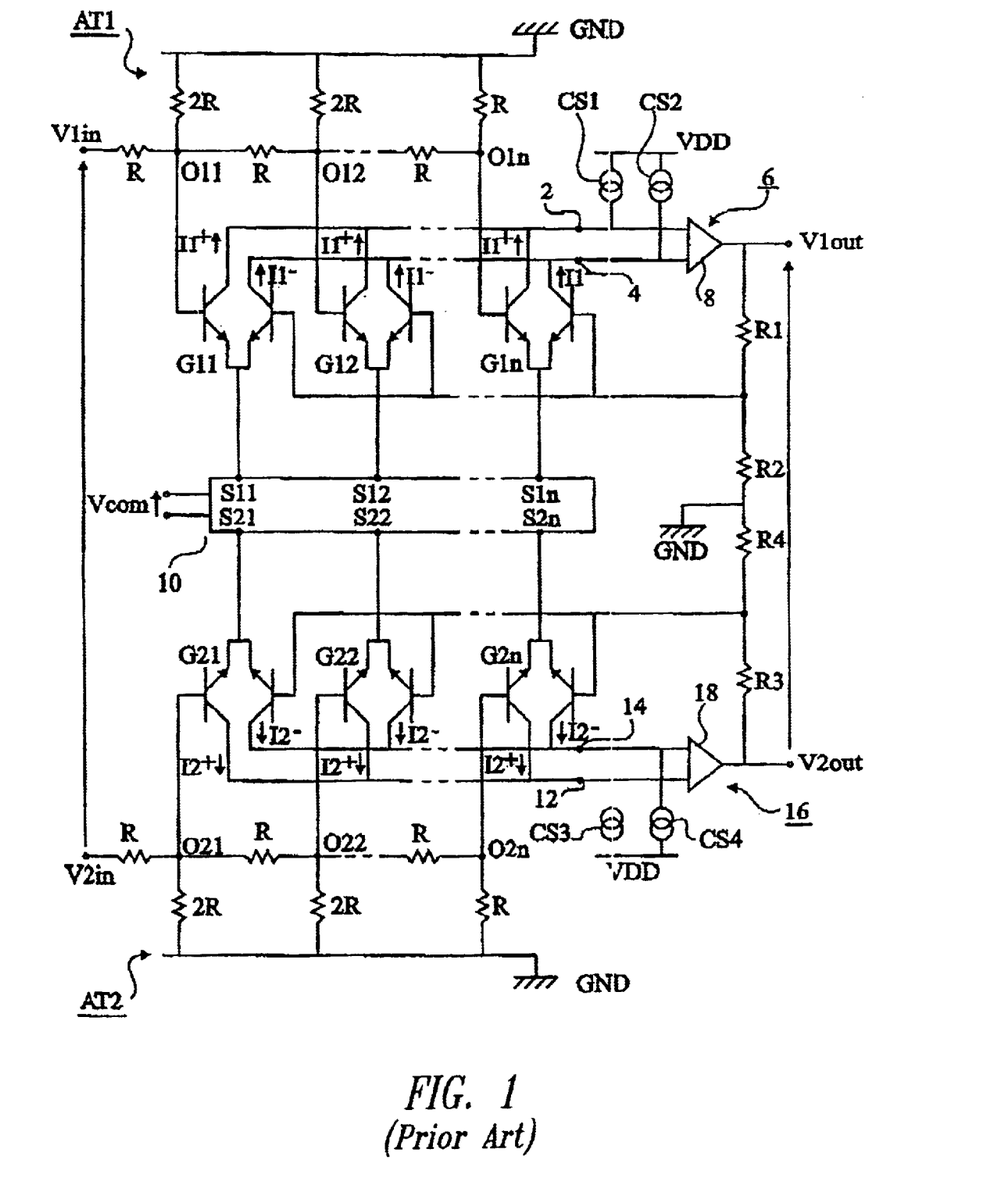
FIG. 1, previously described, schematically shows a conventional variable-gain amplifier.

Voltage V1in is provided to an attenuator network AT1 referenced to a ground potential GND and having n output nodes O1$i$ ($i$ ranging between 1 and n). Each output node O1$i$ generates a control voltage equal to input voltage V1in attenuated according to a predetermined ratio, for example $2^i$ when network AT1 is an R/2R network. The amplifier includes a first assembly of transconductor elements G1$i$ controllable by a current and formed, for example, of two bipolar transistors connected as shown. Each transconductor element G1$i$ receives on a first input the voltage generated by the node O1$i$ of same rank $i$. Each transconductor element G1$i$ is provided for providing a positive current I1$^+$ on a current output terminal 2 and a negative current I1$^-$ on a current output terminal 4. Output terminals 2 and 4 respectively form the first and second input terminals of an output block 6. Output block 6 includes a current-to-voltage conversion element 8 having two input terminals and one output terminal. The two input terminals of converter 8 correspond to the two input terminals of block 6. Two current sources CS1, CS2 are arranged between a supply voltage VDD and respectively the first and second input terminals of block 6. The output terminal of converter 8 is connected to potential GND via a dividing bridge formed of two resistors R1, R2, the junction point of which is connected to provide a feedback signal to a second input of each transconductor element G1$i$. The output terminal of converter 8 provides a voltage V1out. The amplifier further includes an assembly of controllable current sources 10 having n output terminals S1$i$. Each output terminal S1$i$ is connected to control the transconductance of the transconductor element G1$i$ of same rank $i$. The assembly of current sources 10 is controlled by an analog control voltage Vcom.

Voltage V2in is provided to an attenuator network AT2 identical to network AT1, referenced to potential GND, and having n output nodes O2$i$. The amplifier includes a second assembly of transconductor elements G2$i$ controllable by a current, each of which receives on a first input the voltage generated by the node O2$i$ of same rank $i$. Each transconductor element G2$i$ is provided to provide a positive current I2$^+$ on a current output terminal 12 and a negative current I2$^-$ on a current output terminal 14, respectively forming the first and second input terminals of an output block 16. Output block 16 includes a current-to-voltage conversion element 18, having its two input terminals connected to the two input terminals of block 16. Two current sources CS3, CS4 are respectively arranged between supply voltage VDD and the first and second input terminals of block 16. The output of converter 18 is connected to potential GND via a dividing bridge formed of two resistors R3, R4, the junction point of which is connected to provide a feedback signal to a second input of each transconductor element G2$i$. The output terminal of converter 18 provides a voltage V2out. Assembly 10 of current sources includes n output terminals S2$i$, each of which is connected to a transconductor element of same rank $i$.

Attenuator networks AT1 and AT2 form a differential attenuator block receiving differential input signal V1in–V2in. Each pair of output nodes O1$i$, O2$i$ of the differential attenuator block provides a control voltage to the pair of transconductor elements G1$i$, G2$i$ of same rank. Each pair of transconductor elements G1$i$, G2$i$ forms a differential transconductor element. Output blocks 6 and 16 form a differential output block receiving the currents provided by each differential transconductor element G1$i$, G2$i$ and generating the differential output signal V1out–V2out. The output pairs S1$i$, S2$i$ of current source assembly 10 generate matched pairs of control currents to control each differential transconductor element G1$i$, G2$i$. The amplifier described hereabove is the object of a still unpublished French patent application and does not belong to the state of the art.

For such an amplifier to have a satisfactory operation, current-to-voltage conversion elements 8 and 18 must be matched. If not, the amplifier half which receives voltage V1in and generates voltage V1out and the amplifier half which receives voltage V2in and generates voltage V2out have different gains and bandwidths, which causes a distortion of the amplifier output signal. In practice, it is difficult to form two matched current-to-voltage converters 8 and 18.

Further, current source pairs CS1, CS2, and CS3, CS4 operate in a decorrelated manner, which can contribute to increasing the noise level of the amplifier.

Further, each of voltage signals V1out and V2out is generated by a non-symmetrical amplifier which does not suppress the distortion due to the harmonic of second order.

BRIEF SUMMARY OF THE INVENTION

The disclosed embodiments of the present invention provide a variable-gain amplifier with a differential input and output, the gain of which varies exponentially as a response to an analog control voltage, and which exhibits a small harmonic distortion and low noise.

To achieve the foregoing, an embodiment of the present invention especially provides a variable-gain amplifier with differential input and output, including an attenuator block referenced to the common mode voltage of the amplifier output, receiving an input voltage and adapted to providing, on several outputs, voltages, each of which is equal to the input voltage attenuated according to a predetermined ratio; differential transconductor elements controllable by a current, each differential transconductor element having a first input connected to an output of the attenuator block, each differential transconductor element generating first and second positive currents and first and second negative currents; a current source assembly adapted to controlling the transconductance of each differential transconductor element according to an analog control signal; and an output block converting first and second input currents into a differential output voltage and providing a second input of each differential transconductor element with a feedback voltage depending on the output voltage, the first input current being equal to the sum of the first positive currents and of the second negative currents and the second input current being equal to the sum of the second positive currents and of the first negative currents.

According to an embodiment of the present invention, the attenuator block includes two attenuator networks of R/2R type respectively receiving first and second input voltages, each output of the attenuator block including an output node of each attenuator network, the output node generating an attenuated voltage equal to the input voltage received by said network, attenuated according to the predetermined ratio specific to said output; each differential transconductor element includes two pairs of bipolar transistors, the emitters of the transistors of a first pair being connected to a first current control terminal of the differential transconductor element, and the emitters of the transistors of the second pair being connected to a second current control terminal of the differential transconductor element, the first input of the differential transconductor element being formed by the bases of the first two transistors of the two transistor pairs, the second input of the differential transconductor element being formed by the bases of the two second transistors of the two transistor pairs, the two bases forming the first input of the differential transconductor element being respectively connected to the output nodes of the output of the attenuator block connected to the differential transconductor element, the two bases forming the second input of the differential transconductor element being submitted to the feedback voltage, the collectors of the first transistors generating the first and second positive currents, and the collectors of the second transistors generating the first and second negative currents; and the current source assembly includes pairs of control terminals connected to the first and second current control terminals of each differential transconductor element.

According to an embodiment of the present invention, the output block includes: a current-to-voltage conversion element having first and second input terminals respectively provided for receiving the first and second input currents, generating the common mode voltage on a common mode output terminal, and respectively generating first and second output voltages on first and second output terminals, first and second resistive dividing bridges respectively arranged between the first and second output terminals of the current-to-voltage conversion element and the common mode voltage, the midpoint of the first and second resistive dividing bridges generating the feedback voltage; and first and second current sources respectively arranged between a supply voltage and the first and second input terminals of the output block.

According to an embodiment of the present invention, the current-to-voltage conversion element includes: first and second identical P-type MOS transistors, having their sources connected to the supply voltage, having their gates connected to each other, having their respective drains connected to the first and second input terminals of the current-to-voltage conversion element; third and fourth identical P-type MOS transistors, having their sources connected to the supply voltage, having their respective gates connected to the respective drains of the first and second MOS transistors, having their respective drains connected to the first and second output terminals of the current-to-voltage conversion element; third and fourth current sources arranged between the respective drains of the third and fourth transistors and a first reference voltage; two identical resistors each connected between the respective drains of the third and fourth transistors and the common mode output terminal; and a differential amplifier having a first input connected to the common mode output terminal, having a second input connected to a second reference voltage, and having its output connected to the gates of the first and second transistors.

BRIEF DESCRIPTION OF THE SEVERAL VIEWS OF THE DRAWINGS

The foregoing objects, features and advantages of the present invention will be discussed in detail in the following non-limiting description of specific embodiments, in conjunction with the accompanying drawings, wherein.

DETAILED DESCRIPTION OF THE INVENTION

Only those elements necessary to the understanding of the present invention have been shown in the following drawings. Same reference numbers represent the same elements in the previous drawing and in the following drawings.

Figure 2:
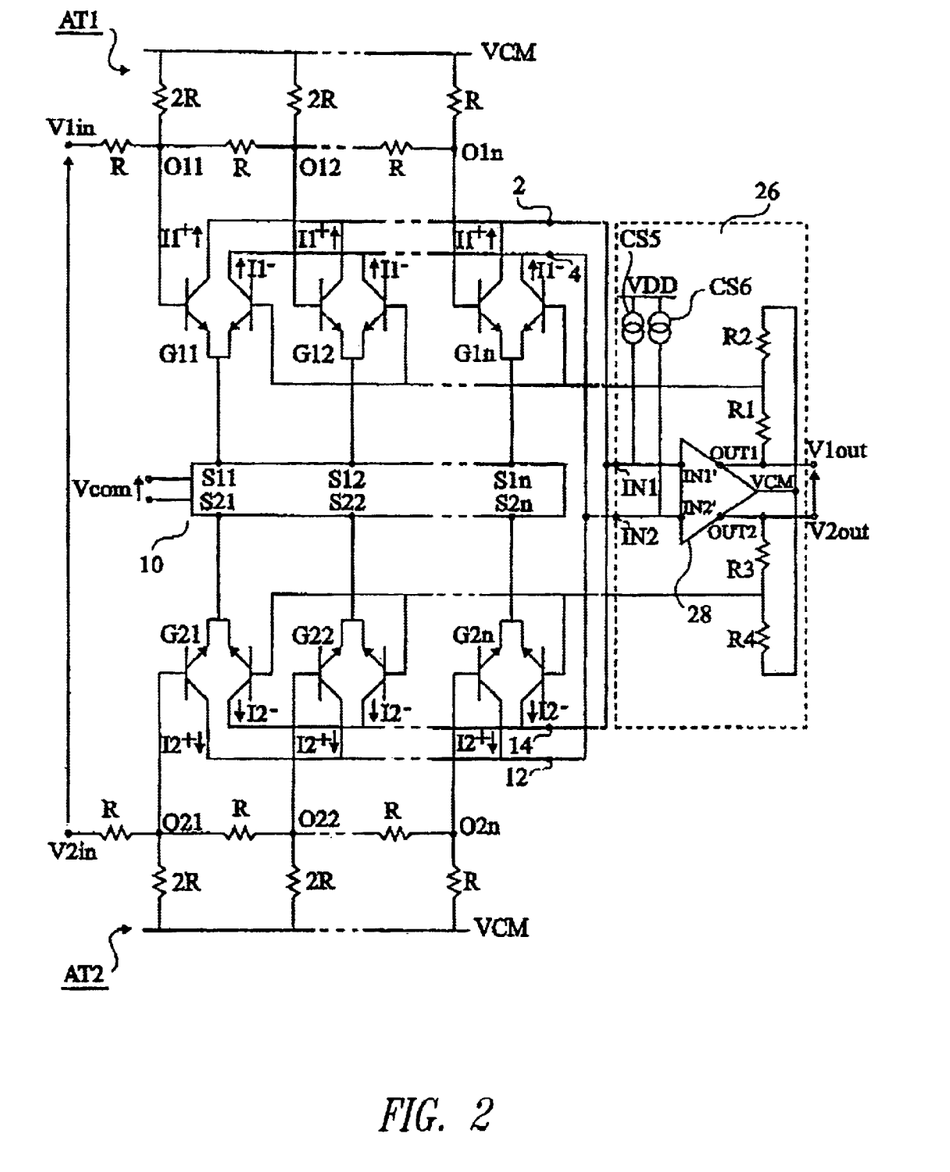
FIG. 2 schematically shows a variable-gain amplifier according to the present invention.

FIG. 2 schematically shows an embodiment of a variable-gain amplifier according to the present invention, intended for receiving a differential voltage V1in–V2in and for providing as a response a differential voltage V1out–V2out. The amplifier includes a first attenuator network AT1 of R/2R type receiving voltage V1in on an input terminal and having n output nodes O1$i$. According to the present invention, attenuator network AT1 is referenced to common mode voltage VCM of the amplifier output. The amplifier includes a first assembly of transconductor elements G1$i$ controllable by a current, each of which receives on a first input the voltage generated by the node O1$i$ of same rank i. Each transconductor element G1$i$ includes a pair of bipolar transistors, the emitters of which are connected to a current control terminal of element G1$i$. The base of a first transistor forms a first input of element G1$i$. The base of the second transistor forms a second input of element G1$i$. The collector of the first transistor provides a positive current I1$^+$ to a current output terminal 2. The collector of the second transistor provides a negative current I1$^-$ to a current output terminal 4. The amplifier includes a second attenuator network AT2 identical to network AT1, receiving voltage V2in on an input terminal, having n output nodes O2$i$, and referenced to voltage VCM. The amplifier includes a second assembly of transconductor elements G2$i$ controllable by a current, each of which receives on a first input the voltage generated by the node O2$i$ of same rank i. Each transconductor element G2$i$ includes a pair of bipolar transistors having their emitters connected to a current control terminal of element G2$i$. The base of a first transistor forms a first input of element G2$i$. The base of the second transistor forms a second input of element G2$i$. The collector of the first transistor provides a positive current I2$^+$ to a current output terminal 12. The collector of the second transistor provides a negative current I2$^-$ to a current output terminal 14.

The transconductor elements G1$i$ and G2$i$ of same rank form a differential transconductor element G1$i$, G2$i$. The transconductance of each differential transconductor element G1$i$, G2$i$ is controlled by the output pairs S1$i$, S2$i$ of a controllable current assembly 10 connected to the current control terminals of the differential transconductor element. An example of forming of current source assembly 10 is described hereafter.

According to this embodiment of the present invention, the amplifier includes a single output block 26 having first and second input terminals IN1, IN2 and including a current-to-voltage conversion element 28. Current-to-voltage conversion element 28 has first and second input terminals IN1' and IN2' respectively connected to terminals IN1 and IN2. Current-to-voltage conversion element 28 further includes first and second output terminals OUT1, OUT2 and a common mode output terminal generating voltage VCM. Terminal IN1 is connected to current output terminals 2 and 14. Terminal IN1 receives a first input current equal to the sum of the positive currents I1+ generated by transconductor elements G1i and of the negative currents I2− generated by transconductor elements G2i. Terminal IN2 is connected to current output terminals 4 and 12. Terminal IN2 receives a second input current equal to the sum of the negative currents I1− generated by transconductor elements G1i and of the positive currents I2+ generated by transconductor elements G2i. A current source CS5 is arranged between terminal IN1 and a supply voltage VDD. A current source CS6 is arranged between terminal IN2 and supply voltage VDD. The first output terminal OUT1 of element 28 is connected to voltage VCM via a first dividing bridge formed of two resistors R1, R2. The midpoint of the first dividing bridge is connected to provide a feedback signal to the second input terminal of each transconductor element G1i. The second output terminal OUT2 of element 28 is connected to voltage VCM via a second dividing bridge formed of two resistors R3, R4. The midpoint of the second dividing bridge is connected to provide a feedback signal to the second input terminal of each transconductor element G2i. Output terminal OUT1 provides output voltage V1 out and output terminal OUT2 provides output voltage V2out.

The amplifier generates differential voltage signal V1out–V2out from differential voltage signal V1in–V2in by means of a single current-to-voltage conversion element 28, which enables suppressing distortion problems due to the difficulties of matching the two current-to-voltage conversion elements of a conventional amplifier.

The first and second input terminals IN1 and IN2 of current-to-voltage conversion element 28 are each connected to a single current source, respectively CS5 and CS6. The two current sources CS5 and CS6 replace the two current source pairs CS1, CS2 and CS3, CS4 operating in a decorrelated way of a conventional amplifier, which enables reducing the noise coming from power supply VDD.

The amplifier according to this embodiment of the present invention is a symmetrical assembly that eliminates the second harmonic term from output signal V1out–V2out.

The input of the amplifier is a differential signal referenced to common mode voltage VCM. As a result, for a given dynamic range, a lower supply voltage than in the case of two input terminals referenced to ground can be used.

Figure 3:
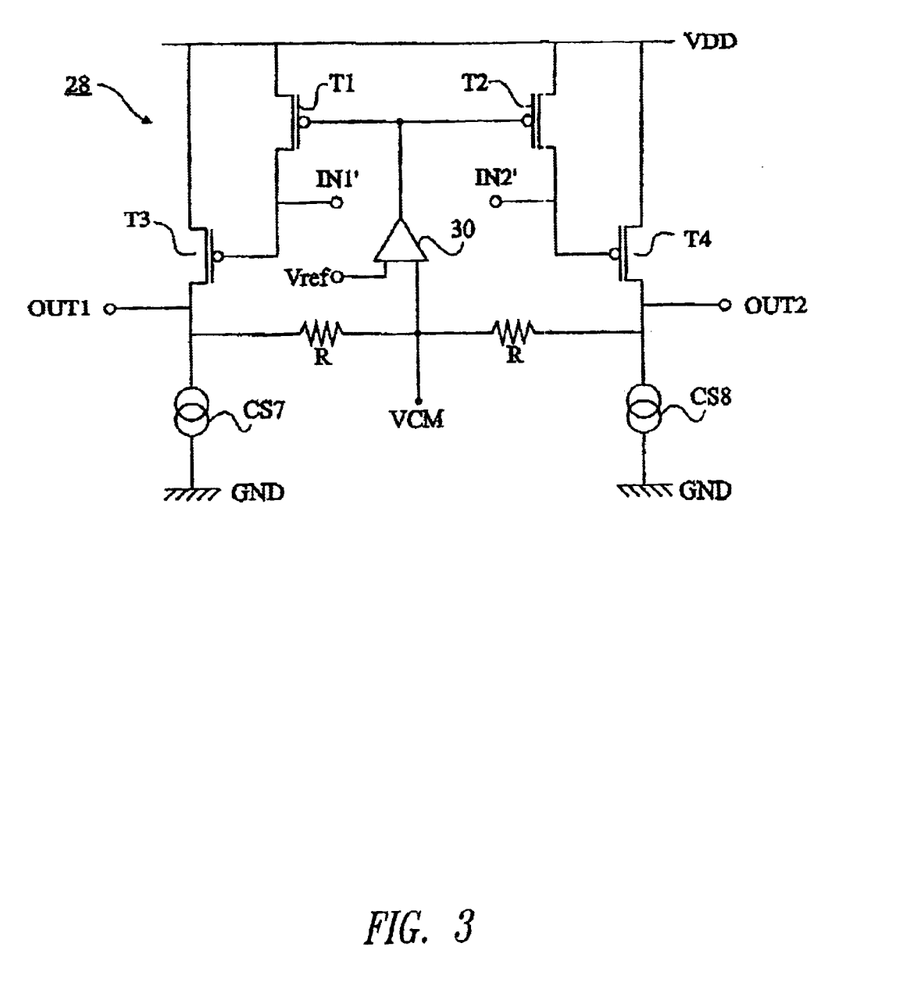
FIG. 3 schematically shows an embodiment of the current-to-voltage conversion element of FIG. 2.

FIG. 3 schematically shows an embodiment of a current-to-voltage conversion element 28. Two identical P-type MOS transistors T1 and T2 have their sources connected to voltage VDD and their gates connected to each other. The respective drains of transistors T1 and T2 are connected to terminals IN1' and IN2'. Two identical P-type MOS transistors T3 and T4 have their sources connected to voltage VDD and their respective gates connected to terminals IN1' and IN2'. The respective drains of transistors T3 and T4 are connected to terminals OUT1 and OUT2. Current sources CS7 and CS8 are respectively arranged between the respective drains of transistors T3 and T4 and a ground voltage GND. The drain of each of transistors T3 and T4 is connected to the common mode output terminal by a resistor R. A differential amplifier 30 has a first input connected to the common mode output voltage and a second input connected to a reference voltage Vref. The output of amplifier 30 is connected to the gates of transistors T1 and T2.

Figure 4:
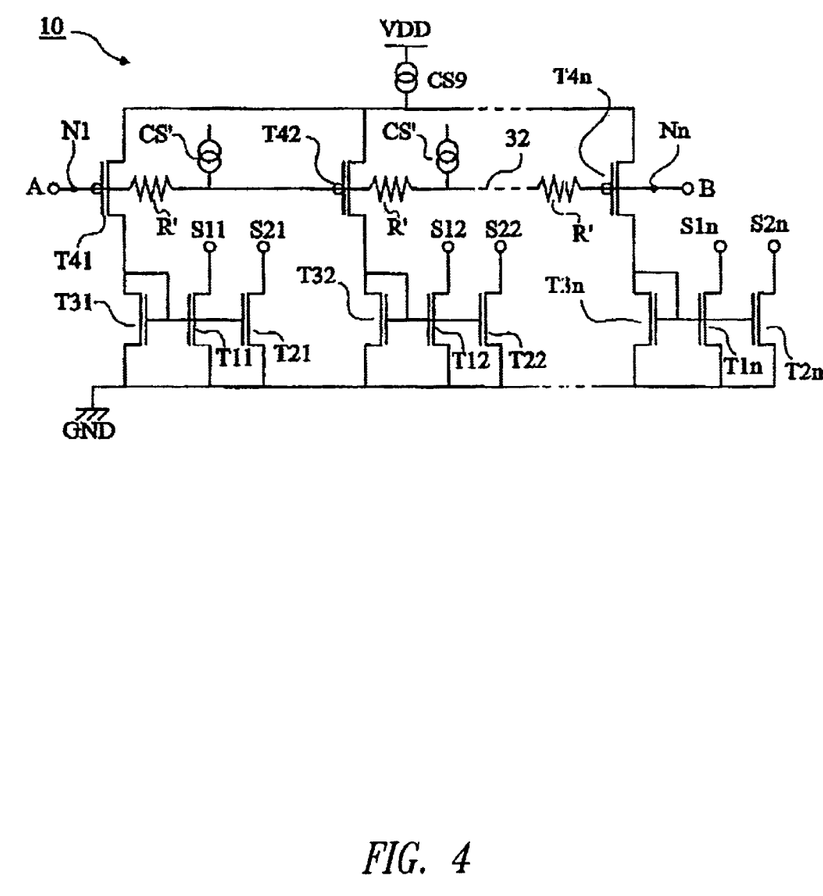
FIG. 4 schematically shows an embodiment of the controllable current source assembly of FIG. 2.

FIG. 4 schematically shows an embodiment of controllable current source assembly 10. Current source assembly 10 includes n pairs of output terminals S1i, S2i and two control terminals A and B. Control voltage Vcom is provided across terminals A and B. Each output terminal S1i, S2i is respectively connected to the drain of N-channel MOS transistors T1i, T2i. Transistors T1i and T2i are matched. The source of transistors T1i, T2i is connected to ground (GND). Transistor pair T1i, T2i is associated with an N-channel MOS transistor T3i and with a P-channel MOS transistor T4i. The source of transistor T3i is grounded. The gate and drain of transistor T3i are interconnected. The gate of transistors T1i, T2i is connected to the gate of transistor T3i so that two matched currents depending on the current in transistor T3i run through transistors T1i and T2i. The drain of transistor T3i is connected to the drain of transistor T4i, so that these transistors are in series. The source of transistor T4i is connected to supply voltage VDD via a single constant current source CS9. The gate of transistor T4i is connected to a node Ni of a control means 32 formed of resistors R' and of current sources CS'. In control means 32, the first node N1 is coupled to terminal A, the last node Nn is coupled to terminal B, each node Nj (j ranging between 1 and n−1) is connected to node Nj+1 via a resistor R' and each node Nj (j ranging from 2 to n−1) is connected to a first terminal of a constant current source CS' specific to this node. Control means 32 is provided to successively progressively turn on, then progressively turn off, each transistor T4i when voltage Vcom undergoes a predetermined variation, so that the sum of the currents flowing through transistors T4i is substantially constant. Each output terminal S1i, S2i provides a current depending on the current flowing through transistor T4i.

The disclosed embodiments of the present invention may have various alterations, modifications, and improvements that will readily occur to those skilled in the art. The present invention has been described in relation with a particular controllable current source assembly 10, but those skilled in the art may adapt the present invention to a current source assembly having an equivalent function. For example, such an assembly may be obtained by doubling the current source assembly used to control the variable-gain amplifier with a non-differential input and output described in U.S. Pat. No. 5,077,541.

The present invention has been described in relation with a differential attenuator block using R/2R dividing networks, but those skilled in the art may adapt the same to other attenuator blocks having different attenuation ratios.

The present invention has also been described in relation with a specific current-to-voltage conversion element 28, but those skilled in the art may adapt the present invention to any equivalent current-to-voltage conversion element.

In the foregoing description, first input IN1 of block 26 receives the sum of the positive currents I1+ generated by transconductor elements G1i and of the negative currents I2− generated by transconductor elements G2i. Similarly, the second input IN2 of block 26 receives the sum of the negative currents I1− generated by transconductor elements G1i and of the positive currents I2− generated by transconductor elements G2i. However, those skilled in the art may adapt the present invention to the case where the first input IN1 of block 26 receives the sum of the negative currents I1− generated by the transconductor elements G1i and of the positive currents I2+ generated by the transconductor elements G2$i$, and where the second input IN2 of block 26 receives the sum of the positive currents I1+ generated by the transconductor elements G1$i$ and of the negative currents I2− generated by the transconductor elements G2$i$.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereof.

What is claimed is:

1. A variable-gain amplifier with differential input and output, comprising:
    an attenuator block referenced to a common mode voltage of an output of the amplifier, receiving an input voltage and adapted to providing, on several outputs, voltages, each of which is equal to the input voltage attenuated according to a predetermined ratio,
    differential transconductor elements controllable by a current, each differential transconductor element having a first input connected to an output of the attenuator block, each differential transconductor element generating first and second positive currents and first and second negative currents,
    a current source assembly adapted to controlling the transconductance of each differential transconductor element according to an analog control signal, and
    an output block converting first and second input currents into a differential output voltage and providing a second input of each differential transconductor element with a feedback voltage depending on the output voltage, the first input current being equal to the sum of the first positive currents and of the second negative currents and the second input current being equal to the sum of the second positive currents and of the first negative currents.

2. The amplifier of claim 1, wherein:
    the attenuator block comprises two attenuator networks of R/2R type, respectively receiving first and second input voltages, each output of the attenuator block comprising an output node of each attenuator network, the output node generating an attenuated voltage equal to the input voltage received by said network, attenuated according to the predetermined ratio specific to said output,
    each differential transconductor element comprising two pairs of bipolar transistors, the emitters of the transistors of a first pair being connected to a first current control terminal of the differential transconductor element, and the emitters of the transistors of the second pair being connected to a second current control terminal of the differential transconductor element, the first input of the differential transconductor element being formed by the bases of the first two transistors of the two transistor pairs, the second input of the differential transconductor element being formed by the bases of the two second transistors of the two transistor pairs, the two bases forming the first input of the differential transconductor element being respectively connected to the output nodes of the output of the attenuator block connected to the differential transconductor element, the two bases forming the second input of the differential transconductor element being submitted to the feedback voltage, the collectors of the first transistors generating the first and second positive currents, and the collectors of the second transistors generating the first and second negative currents, and
    the current source assembly includes pairs of control terminals connected to the first and second current control terminals of each differential transconductor element.

3. The amplifier of claim 1, wherein the output block comprises:
    a current-to-voltage conversion element having first and second input terminals respectively provided for receiving the first and second input currents, generating the common mode voltage on a common mode output terminal, and respectively generating first and second output voltages on first and second output terminals,
    first and second resistive dividing bridges respectively coupled between the first and second output terminals of the current-to-voltage conversion element and the common mode voltage, the midpoint of the first and second resistive dividing bridges generating the feedback voltage, and
    first and second current sources respectively coupled between a supply voltage and the first and second input terminals of the output block.

4. The amplifier of claim 3, wherein the current-to-voltage conversion element comprises:
    first and second identical P-type MOS transistors, having their sources connected to the supply voltage, having their gates connected to each other, having their respective drains connected to the first and second input terminals of the current-to-voltage conversion element,
    third and fourth identical P-type MOS transistors, having their sources connected to the supply voltage, having their respective gates connected to the respective drains of the first and second MOS transistors, having their respective drains connected to the first and second output terminals of the current-to-voltage conversion element,
    third and fourth current sources arranged between the respective drains of the third and fourth transistors and a first reference voltage,
    two identical resistors each connected between the respective drains of the third and fourth transistors and the common mode output terminal, and
    a differential amplifier having a first input connected to the common mode output terminal, having a second input connected to a second reference voltage, and having its output connected to the gates of the first and second transistors.

5. A variable gain amplifier having a differential input and differential output, the amplifier comprising:
    an attenuator circuit configured to receive an input voltage from the differential input, to attenuate the input voltage, and to provide a plurality of attenuated output voltages;
    a plurality of differential transconductor circuits, each differential transconductor circuit having a first input connected to a respective attenuated output voltage from the attenuator circuit and configured to generate first and second positive currents and first and second negative currents;
    a current source assembly configured to control a transconductance of each differential transconductor circuit according to an analog control signal; and
    an output block configured to convert the first and second input currents into a differential output voltage and to provide a second input of each differential transconductor circuit with a feedback voltage that is dependent on the differential output voltage.

6. A variable-gain amplifier with differential input and output, the amplifier comprising:
   a differential input stage configured to receive first and second differential inputs and to generate first and second positive currents and first and second negative currents; and
   an output stage configured to receive and convert the first and second negative currents and the first and second positive currents into first and second differential output voltages, and to provide a feedback voltage to the differential input stage dependent on an output of the differential output voltages.

7. A variable-gain amplifier with differential input and output, comprising:
   a differential input stage configured to receive first and second differential inputs and to generate first and second positive currents and first and second negative currents; and
   an output stage configured to receive and convert the first and second positive currents and the first and second negative currents into first and second differential output voltages on first and second outputs and to provide a feedback voltage to the differential input stage that is dependent on the output voltages on the first and second outputs, the output stage further comprising a first resistive bridge comprising first and second resistors coupled in series with each other and between the first output and a common mode terminal, and a second resistive bridge comprising third and fourth resistors coupled in series with each other and between the second output and the common mode terminal.

8. A variable-gain amplifier with differential input and output, comprising:
   a differential input stage configured to receive first and second differential inputs and to generate first and second positive currents and first and second negative currents therefrom; and
   an output stage configured to receive and convert the first and second positive currents and the first and second negative currents into first and second differential output voltages on first and second outputs and to provide a feedback voltage to the differential input stage that is dependent on the output voltages on the first and second outputs, the output stage further comprising a first resistive bridge comprising first and second resistors coupled in series with each other and between the first output and a common mode terminal, and a second resistive bridge comprising third and fourth resistors coupled in series with each other and between the second output and the common mode terminal, the output stage further comprising a current-to-voltage conversion circuit having first and second input terminals respectively provided for receiving a first current input comprising the sum of the first positive current and the second negative current, and for receiving a second input current comprising the sum of the second positive current and the first negative current, and configured to generate a common mode voltage on the common mode terminal, and respectively generating first and second output voltages on the first and second outputs that are received by the first and second resistive bridges.

9. A variable-gain amplifier with differential input and output, comprising:
   an attenuator block referenced to a common mode voltage of an output of the amplifier, receiving an input voltage and adapted to providing, on a plurality of outputs, a plurality of attenuated voltages, the attenuator block comprising two attenuator networks of R/2R type, respectively receiving first and second input voltages, each output of the attenuator block comprising an output node of each attenuator network, the output node generating an attenuated voltage equal to the input voltage received by the network and attenuated according to a predetermined ratio specific to the output;
   a plurality of differential transconductor elements controllable by a current, each differential transconductor element having a first input connected to an output of the attenuator block, each differential transconductor element generating first and second positive currents and first and second negative currents,
   a current source assembly adapted to controlling the transconductance of each differential transconductor element according to an analog control signal, and
   an output block converting first and second input currents into a differential output voltage and providing a second input of each differential transconductor element with a feedback voltage depending on the output voltage, the first input current being equal to the sum of the first positive currents and of the second negative currents and the second input current being equal to the sum of the second positive currents and of the first negative currents.

10. A variable-gain amplifier with differential input and output, comprising:
    an attenuator block referenced to a common mode voltage of an output of the amplifier, receiving an input voltage and adapted to providing, on a plurality of outputs, a plurality of voltages, the attenuator block comprising two attenuator networks of R/2R type, respectively receiving first and second input voltages, each output of the attenuator block comprising an output node of each attenuator network, the output node generating an attenuated voltage equal to the input voltage received by the network and attenuated according to a predetermined ratio specific to the output;
    a plurality of differential transconductor elements controllable by a current, each differential transconductor element having a first input connected to an output of the attenuator block, each differential transconductor element generating first and second positive currents and first and second negative currents, each differential transconductor element comprising two pairs of bipolar transistors, the emitters of the transistors of a first pair being connected to a first current control terminal of the differential transconductor element, and the emitters of the transistors of the second pair being connected to a second current control terminal of the differential transconductor element, the first input of the differential transconductor element being formed by the bases of the first two transistors of the two transistor pairs, the second input of the differential transconductor element being formed by the bases of the two second transistors of the two transistor pairs, the two bases forming the first input of the differential transconductor element being respectively connected to the output nodes of the output of the attenuator block connected to the differential transconductor element, the two bases forming the second input of the differential transconductor element being submitted to the feedback voltage, the collectors of the first transistors generating the first and second positive currents, and the collectors of the second transistors generating the first and second negative currents, a current source assembly adapted to controlling the transconductance of each differential transconductor element according to an analog control signal, the current source assembly comprising pairs of control terminals connected to the first and second current control terminals of each differential transconductor element, and an output block converting first and second input currents into a differential output voltage and providing a second input of each differential transconductor element with a feedback voltage depending on the output voltage, the first input current being equal to the sum of the first positive currents and of the second negative currents and the second input current being equal to the sum of the second positive currents and of the first negative currents, the output block comprising:

a current-to-voltage conversion element having first and second input terminals respectively provided for receiving the first and second input currents, generating the common mode voltage on a common mode output terminal, and respectively generating first and second output voltages on first and second output terminals, first and second resistive dividing bridges respectively coupled between the first and second output terminals of the current-to-voltage conversion element and the common mode voltage, the midpoint of the first and second resistive dividing bridges generating the feedback voltage, and first and second current sources respectively coupled between a supply voltage and the first and second input terminals of the output block.

11. A variable-gain amplifier with differential input and output, comprising:

an attenuator block referenced to a common mode voltage of an output of the amplifier, receiving an input voltage and adapted to providing, on a plurality of outputs, a plurality of voltages, the attenuator block comprising two attenuator networks of R/2R type, respectively receiving first and second input voltages, each output of the attenuator block comprising an output node of each attenuator network, the output node generating an attenuated voltage equal to the input voltage received by the network and attenuated according to a predetermined ratio specific to the output;

differential transconductor elements controllable by a current, each differential transconductor element having a first input connected to an output of the attenuator block, each differential transconductor element generating first and second positive currents and first and second negative currents, each differential transconductor element comprising two pairs of bipolar transistors, the emitters of the transistors of a first pair being connected to a first current control terminal of the differential transconductor element, and the emitters of the transistors of the second pair being connected to a second current control terminal of the differential transconductor element, the first input of the differential transconductor element being formed by the bases of the first two transistors of the two transistor pairs, the second input of the differential transconductor element being formed by the bases of the two second transistors of the two transistor pairs, the two bases forming the first input of the differential transconductor element being respectively connected to the output nodes of the output of the attenuator block connected to the differential transconductor element, the two bases forming the second input of the differential transconductor element being submitted to the feedback voltage, the collectors of the first transistors generating the first and second positive currents, and the collectors of the second transistors generating the first and second negative currents, a current source assembly adapted to controlling the transconductance of each differential transconductor element according to an analog control signal, the current source assembly comprising pairs of control terminals connected to the first and second current control terminals of each differential transconductor element, and an output block converting first and second input currents into a differential output voltage and providing a second input of each differential transconductor element with a feedback voltage depending on the output voltage, the first input current being equal to the sum of the first positive currents and of the second negative currents and the second input current being equal to the sum of the second positive currents and of the first negative currents, the output block comprising:

a current-to-voltage conversion element having first and second input terminals respectively provided for receiving the first and second input currents, generating the common mode voltage on a common mode output terminal, and respectively generating first and second output voltages on first and second output terminals, the current-to-voltage conversion element comprising first and second identical P-type MOS transistors, having their sources connected to the supply voltage, having their gates connected to each other, having their respective drains connected to the first and second input terminals of the current-to-voltage conversion element, third and fourth identical P-type MOS transistors, having their sources connected to the supply voltage, having their respective gates connected to the respective drains of the first and second MOS transistors, having their respective drains connected to the first and second output terminals of the current-to-voltage conversion element, third and fourth current sources arranged between the respective drains of the third and fourth transistors and a first reference voltage, two identical resistors each connected between the respective drains of the third and fourth transistors and the common mode output terminal, and a differential amplifier having a first input connected to the common mode output terminal, having a second input connected to a second reference voltage, and having its output connected to the gates of the first and second transistors;

first and second resistive dividing bridges respectively coupled between the first and second output terminals of the current-to-voltage conversion element and the common mode voltage, the midpoint of the first and second resistive dividing bridges generating the feedback voltage, and first and second current sources respectively coupled between a supply voltage and the first and second input terminals of the output block.

12. A variable-gain amplification method for use with a variable-gain amplifier having differential input and differential output, the method comprising:

receiving an input voltage in an attenuator block and providing, on a plurality of outputs of the attenuator block, a plurality of voltages, each of the plurality of voltages equal to an attenuation of the input voltage in accordance with a predetermined attention ratio;

receiving the attenuated input voltages at respective differential transconductor elements and generating therefrom first and second positive currents and first and second negative currents;

receiving an analog control signal at a current source assembly and controlling the transconductance of each differential transconductor element responsive to the analog control signal; and receiving at an output block a first input current comprising the sum of the first positive current and the second negative current, and further receiving a second input current that is the sum of the second positive current and the first negative current and converting the same into differential output voltages and providing a second input of each differential transconductor element with a feedback voltage that is dependent on the differential output voltages.

13. A variable-gain amplification method for use with a variable-gain amplifier having a differential input and differential output, the method comprising:

receiving an input voltage at an attenuator block that is referenced to a common mode voltage of an output of the variable-gain amplifier, and generating on a plurality of outputs a plurality of voltages, each voltage equal to an attenuation of the input voltage according to a predetermined ratio;

receiving from the plurality of outputs the attenuated voltages that are controlled by a current, each differential transconductor element generating first and second positive currents and first and second negative currents;

receiving an analog control signal at a current source assembly and generating a current to control the transconductance of each differential transconductive element; and receiving at an output block a first input current comprising the sum of the first positive current and the second negative current and a second input current that is the sum of the second positive current and the first negative current and generating a differential output voltage therefrom, and providing a second input of each differential transconductor element with a feedback voltage that is dependent on the differential output voltage.

* * * * *